United States Patent [19]

Shamir

[11] Patent Number: 5,118,369
[45] Date of Patent: Jun. 2, 1992

[54] MICROLABELLING SYSTEM AND PROCESS FOR MAKING MICROLABELS

[75] Inventor: Harry A. Shamir, Newton Centre, Mass.

[73] Assignee: ColorCode Unlimited Corporation, Newton, Mass.

[21] Appl. No.: 572,164

[22] Filed: Aug. 23, 1990

[51] Int. Cl.$^5$ .............................................. B32B 31/00
[52] U.S. Cl. ........................................ 156/64; 283/81; 250/566; 235/462
[58] Field of Search ........................ 209/938, 939, 583; 40/360, 630, 638; 283/81, 101, 250; 250/566, 668, 569, 570; 437/924, 245, 246, 187, 194, 197; 235/462

[56] References Cited

U.S. PATENT DOCUMENTS

| | | | |
|---|---|---|---|
| 4,010,355 | 3/1977 | Roehrman et al. | 235/462 |
| 4,239,261 | 12/1980 | Richardson | 283/81 |
| 4,794,238 | 12/1988 | Hampton | 250/566 |

Primary Examiner—David A. Simmons
Assistant Examiner—Robert Barker
Attorney, Agent, or Firm—Robert K. Tendler

[57] ABSTRACT

A method is disclosed for both making microlabels and for using these labels to provide a unique system for identifying an integrated circuit (IC) die on a wafer, in one embodiment, by applying a color bar encoded microlabel, small enough to be placed on the surface of the die, with the microlabel being on the order of 2 mm × 2 mm in overall size. In one embodiment, the label consists of a number of colored lines or bars similar to a black/white bar code, with each bar having a distinct color or hue, the width of the bars being in the 5–120 micron range in terms of width, the bars being either contiguous or separated by a thin bar of distinct color. The microlabels, whether color bar or black/white coded, are applied preferably at the wafer probing stage of manufacture, wherein each die is labelled with the bar code best expressing the parameters the manufacturer is desirous of using for further processing and/or ultimate sales and/or use. A specialized real time photographic technique is disclosed in one embodiment for forming the ultra-small labelling lines on the microlabel's substrate, with the process enabling each microlabel to be different and manufactured on-the-fly to carry information associated with a given die. Further, each die may be labelled with additional microlabels in the subsequent stages of manufacture. Additionally, each capsule or device package containing a die may also be tagged with one or more microlables. Other techniques for producing the microlabels, whether color coded or black and white, include vapor deposition, metallic colored foil layering, each of the above requiring shaving of layered sheets and deposition of colored strips in the furrows of etched or scribed sheets. In a further embodiment, ink jet stripes are laid down on a moving web or substrate in parallel multi-colored rows. The microlabels may be utilized in any application in which product identification requires exceedingly small labels. Moreover, microlabels bearing other indicia such as letters or numerals, either with or without bar codes, offers IC manufacturers and others a unique microlabelling capability.

9 Claims, 10 Drawing Sheets

MICROLABELLING SYSTEM AND PROCESS FOR MAKING MICROLABELS

FIELD OF INVENTION

This invention relates to bar code labelling of articles and more particularly to a system for providing microlabelling of numerous products, including specifically semiconductor chips or dies, wafers, or encapsulation utilizing a colored stripe bar code, a black/white bar code, or other micro indicia.

BACKGROUND OF THE INVENTION

In semiconductor integrated circuit (IC) processing, from the beginning of automated wafer probing, the technique for differentiating Good Dies from Not Good Dies on a wafer containing many dies has remained essentially unchanged. At the probing machine, each Die is provided with an ink dot indicating a fail, and each rejected die is discarded. The ink dots' average size depend on the type of dot dispenser used, but range in the main between 0.005" and 0.021" in diameter. With the increase in die dimensions and complexity and cost, design redundancy has been instituted such that a failed section of a die or IC does not impair its further marketability whether as the originally intended device or as a new device. To this end, rather than just indicating a pass/fail, it is important to label the die with information concerning potential use for the die. If the partially failed device is not rejected, it can be identified as such.

While a pass/fail labelling system differentiates between dies as either Good or Not Good, for differentiating among dies on a more complex basis such as quality and/or test results, the only method existing heretofore for recording quality-of-die information from the probing is by wafer mapping in which the x, y position of each die on a wafer is recorded, as well as information about the die during the probing process. Probing is performed with the probe tips preferentially connected to a test computer very nearby, such that each die on the wafer becomes known in address or x, y location on the wafer, quality and relevant other parameters, and preferentially storing this information on appropriate ambulatory computer readable memory. This information in the ambulatory memory storage travels with the wafer in the subsequent processing steps, and is used to separate the types of dies once the wafer has been diced and the individual dies are sawed apart for handling in separate groups. The mapping is also used for recording device history. This wafer mapping technique is to this day not universally accepted, and causes problems with the easy flow of material on the manufacturing line, since it requires that each wafer, then each die or die group, be accompanied throughout its processes by a computerized data bank identifying its quality and other parameters. Not all existing processes and machinery are amenable to this technique, and considering the large quantity of ICs manufactured today, the management burden is too gargantuan to be practical except for unique cases.

In present day practice, qualitative information gathering is performed at the probing station, and differentiation is done after sawing the devices apart from the original wafer form by physically transferring each device according to quality type, generally to a carrier called 'waffle pack', which is a container holding a number of devices, each device in a separate cavity in a waffle-like container. However, lacking wafer mapping the differentiation between groups of often times based soley on the Good/Not Good ink dot marking. The devices stored in the waffle-like container are very likely to become misoriented in the cavities, and very often even turn upside down, due to the handling. With each waffle pack goes a label of some fashion identifying the devices type. Another method transfers each device onto a sticky tape, usually in the form of a ribbon with cavities, each tape receiving one type of device. Another method applies each device onto a ribbon whose links ultimately become part of the final device form, if for tape automated bonding, Chip-On-Board techniques, encapsulation, or for hybrids.

It is obvious that much of the yield loss in the manufacture of integrated circuits is due to the arbitrary writeoff of marginal devices indeed suitable for some purpose, but where the process of identifying them as such throughout the manufacturing process would require excessive attention to relatively small number of devices per wafer. However, in the cumulative, this number becomes very large indeed.

Another source of excessive yield loss takes place in the handling of the waffle packs, due to mishandling or other mishaps, including mislabelling. Another source of costly effort is in the attempt to orient the devices in the various assembly processes, including turning over and directional orientation, purely on the basis of the visible pattern on top of the device created by the etching/metallization IC generation steps. This need for orientation has bred a whole new industry, that of pattern recognition, involving expensive systems including solid state sensors, cameras, computers and software. A restriction on the use of custom technology for limited quantities is also generated by the practical difficulties of creating more than one device type on a particular wafer, and from the difficulties in tracing individual or small groups of devices in the manufacturing stream. Inevitably, the yield losses and restrictions on manufacturing flexibility translate into higher costs and lost opportunities.

Microlabels, other than ink dots, have not heretofore been used to label dies or any other objects, small or large. In fact microlabels have not heretofore been produced for any purpose. Labelling has existed for large objects which has involved bar code labelling either black/white or color.

With respect to color coded labels, U.S. Pat. No. 4,053,433 describes labels made of colored layers, broken randomly into uneven and geometrically undefined pieces or chips. These chips are produced in a batch process in which all chips broken from a sheet have the same bar code. To use the chips, they must be separated, classified as to bar code and then affixed to the article to be labelled. Thus changing the code for each article is not feasible on-the-fly.

Moreover, the chips have ragged edges. This prevents reading of the code because the code is carried at the edge of the chips in terms of its colored layers. To overcome the reading problem, several techniques are used. One is the use of many such pieces, randomly sprinkled onto the product, and bonded in place. In the process of bonding, some of the pieces adhere with the edges facing the viewer, enabling reading. Another technique involves the creation of at least one magnetic layer. Thus under the influence of a magnet, the chips move after deposition, to erect themselves such that the edges now face the viewer. This however creates a very rough, if colorful, surface on the product. Another possibility is that to inspect the colors, one must physically remove at least one chip, and then use a magnet to hold it in place under an optical instrument. Other manufacturing techniques enable the creation of very large chips where the chip is bondable to the tagged product, with the plane of the layers visible to the viewer without the difficulties inherent in the chips described above. However, this method does not lend itself easily to miniaturization.

Other related bar code labelling U.S. Patents include U.S. Pat. Nos. 4,329,393; 3,861,886; 3,772,200; 4,390,452; 4,044,227; 3,858,506; and 4,844,509.

Moreover, Swedish patent 051613-01 issued Feb. 18, 1988 describes a batch process for color coded labels where the color layers are clearly visible to the viewer at all times. The difficulty this label has in common with all earlier labels is that it must be prepared and stored prior to application, thus requiring batch processing and extensive planning, materials handling, and materials management.

SUMMARY OF INVENTION

In order to eliminate costly and cumbersome chip identification, each die is labelled by a microlabel configured to enable high information density, and in one embodiment encoded with a colored bar code providing data sufficient to determine all relevant performance and quality information. Since this microlabel becomes an inseparable part of the die itself, it can be used for recognition, orientation, process control, stocking, distribution, and other functions. This bar code has stripes or colored areas with a width in the 5-120 micron range, so that in one embodiment sufficient information about the IC is contained within an 80×80 micron area on the IC. Not only does the micro bar code identify the particular IC chip, further differentiation can occur downstream in the manufacturing and quality control processes by application of one or more additional micro color bar labels onto the device, due to the labels' inherent small size.

Additionally, in the die encapsulation process, each encapsulation can be labelled on its outer body by one or more colored bar code microlabels identifying its contents in a unique manner, to the extent desired by the manufacturer. The external microlabel may or may not be essentially the same as the microlabel on the die itself.

If marked by a microlabel, each die no longer has to be physically segregated by type and quality and handled separately to maintain identity and controllability. In one embodiment, a color code scanner identifies the die for automatic recognition and further processing. This allows elimination of manufacturing steps, thus increasing manufacturing yields and efficiencies, which generates cost reductions and improved overall economic value. Moreover, the microlabel may be provided with additional or substitute alpha-numeric micro-indicia if such is desired.

If marked with the subject microlabel, each die or die encapsulation is identifiable at the assembly operation before assembly onto or into a circuit board or hybrid circuit, thus ensuring correct device and orientation. This spares much expense in pattern recognition equipment, losses in mechanical sorting and separating, and management difficulties in labelling, tracking, and expediting. Equipment for aiding in these now superfluous tasks can be eliminated, simplifying the manufacturing process, easing the expediting of otherwise lost devices or specials, and decreasing the time to manufacture ICs.

In summary, a method is disclosed for both making microlabels and for using these labels to provide a unique system for identifying an integrated circuit (IC) die on a wafer, in one embodiment, by applying a color bar encoded microlabel, small enough to be placed on the surface of the die, with the microlabel being on the order of 1 mm×1 mm in overall size. In one embodiment, the label consists of a number of colored lines or bars similar to a black/white bar code, with each bar having a distinct color or hue, the bars being in the 5-120 micron range in terms of width, the bars being either contiguous or separated by a thin bar of distinct color.

The microlabels made by the subject process, whether color bar or black/white coded, are applied preferably at the wafer probing stage of manufacture, wherein each die is labelled with the bar code best expressing the parameters the manufacturer is desirous of using for further processing and/or ultimate sales and/or use. A specialized real time photographic technique is disclosed in one embodiment for forming the ultra-small labelling lines on the microlabel's substrate, with the process enabling each microlabel to be different and manufactured on-the-fly to carry information associated with a given die. Further, each die may be labelled with additional microlabels in the subsequent stages of manufacture. Additionally, each capsule or device package containing a die may also be tagged with one or more similar or identical microlabels.

Other techniques for producing the microlabels, whether color coded or black and white, include vapor deposition, metallic colored foil layering, each of the above requiring shaving of layered sheets and deposition of colored strips in the furrows of etched or scribed sheets. In a further embodiment, ink jet stripes are laid down on a moving web or substrate in parallel multi-colored rows.

The microlabels may be utilized in any application in which product identification requires exceedingly small labels. Moreover, microlabels bearing other indicia such as letters or numerals, either with or without bar codes, offers IC manufacturers and others a unique microlabelling capability.

In one embodiment, the subject microlabel consists of layers of different colors, preferably created by superposition of one colored layer upon the previous layer, in a manner not delaminatable in the subsequent processes. One such layer assemblage can be accomplished by lamination of single or dual color pre-existing sheets, or ribbons of appropriate color materials, pressed or heat bonded together. Another such layer assemblage can be accomplished by application of pigmented carrier liquids such as paints, to the appropriate thickness onto a substrate or previously deposited layers. A further technique makes use of intermediate materials bonding together color layers, where each layer is of uniform color. The layers can be of any appropriate material, such as highly thermal resistant plastics, enamels, glasses, oxides, compounds, metals, or any other suitable array of materials. One embodiment applicable to electronic assembly consists of layers of colored enamel bonded to the substrates by either silicone or acrylic or epoxy based adhesives, or other as appropriate The size of the microlabel is in the microminiature category with an overall size of 1 mm × 1 mm, approximately 0.5 mm thick, in one embodiment.

In color-coded bar code microlabels, bars can exist in various widths e.g.: 10 microns, 20 microns, 40 microns, 60 microns, 80 microns, and others, with the widths choosable in mixed or uniform fashion. A typical construction has color bars 40 microns wide separated by white bars 20 microns wide, with one white bar 40 microns wide at a predetermined location, to indicate microlabel directionality. The number of bars is arbitrary. Such a label bearing 16 color bars and 15 separating bars is 940 microns wide, or slightly less than one millimeter wide overall. Bar lengths can be set arbitrarily at 1.2 mm, creating a rectangle 0.94 mm × 1.2 mm. This size can be easily handled and oriented with current part feeding/handling technology.

Real time microlabel creation can be accomplished through a photographic specialized technique in which the microlatels are prepared on-the-fly by passing rapid development film past a head having a number of focused colored Red, Blue, and Green light sources or any other 3-color set that in combination of varying intensities enables the creation of any color or hue. The pieces of exposed film are indexed, developed, severed, and applied to the associated die so as to label the die with a unique label having a code corresponding to the condition of the die as well as die type.

For photographic microlabel generation a light tight enclosure is provided which functions as both label manufacturing camera and as label dispenser. Within the enclosure is a spool or cartridge of unexposed color film, an exposing apparatus, a film developing apparatus, an indexing mechanism, and a severing mechanism or guillotine.

In one embodiment, the film width is the full width of the final color bar label. Preferentially it is provided in a cartridge for ease of assembly without fear of premature exposure.

The exposing apparatus can take many forms, one of which consists of three rows of Red, Blue, and Green light sources, the number of sources per row corresponding to the number of bars in the final microlabel. Each source is variable in intensity, such that the combination of intensities creates a specific identifiable and recognizable color. Each trio of RBG sources shines on a specific bar location, the geometry of the system enabling focusing of these light sources on the plane of the film to create a specific bar length. Alternatively, the sources are focused to a spot having a diameter of the bar width, and the exposure performed as the film moves during indexing such that an array of bar images is created.

The light intensities, timing, indexing, and other internal controlled features are controlled by a flexible controlling apparatus, such as a computer. Using the above exposing apparatus or any other of similar purpose, one can create on site, the color bar sequence as appropriate to the product being labelled.

Developing the film can be done either before or after deposition of the subject microlabel onto the product to be labelled. There is an advantage of doing the developing within the camera and dispenser, since the alternative requires careful handling of the product before developing the film, lest further exposure occurs. In one embodiment, the developer and fixer, if latter is required by the specific emulsion chemistry used, perform their function within the camera and dispenser such that by the time the label is ready to be deposited onto the product, it is no longer susceptible to alteration.

Transporting the severed label onto the product is accomplished in one embodiment by known pick-and-place apparatus. Bonding the label onto the product can be performed as follows:

One technique involves having the back surface of the film coated with a pressure sensitive adhesive, itself resistant after curing to the environments the product is subjected to in subsequent manufacturing, quality control, and in ultimate use. Two such adhesive families are silicone and acrylic adhesives, such as manufactured by the CHR Corp., of New Haven, Conn. Another technique involves coating the underside of the label with an appropriate adhesive such as one of the above-mentioned adhesives, or through the use of an appropriate epoxy, transferred from the camera and dispenser to the product being labelled. A further technique involves depositing a droplet of appropriate adhesive onto the location at which the label is to be applied.

For applications in labelling dies and devices, it is envisioned that the labelling occurs in the same machine performing the probing of each die, such that the bar sequence can be determined by a coding algorithm. Queuing the labels such that they ultimately reside on the appropriate device is within the state of the art. The materials used for the film body must be able to withstand all the further product processing and use environments. Among the candidates are aluminum or other metal foils, high temperature polymers, and possibly others. One feature all these materials have in common is good rigidity once severed to the label format. It is also preferable that these materials not be prone to creating burrs upon guillotining.

The advantages of this real time photographic technique are first, only one camera and dispenser is required per machine, instead of a large number of dispensers that would be required by a number of different batch-produced color codes. Secondly, one camera and dispenser can provide any color bar sequence, thus enabling flexibility in the labelling. Thirdly, the manufacture of the microlabel occurs at use site, obviating the need for making and stocking large quantities of large numbers of different color bar code labels. Fourth, the width and resolution of each color bar are limited by the characteristics of the photographic process, not by the much grosser limitations of pigment or colored matter deposition technologies.

In another embodiment microlabel generation can be accomplished via a batch technique in which the edges of the built-up layers of colors are shaved at the appropriate thicknesses preferentially ranging between 0.1 mm and 0.9 mm, and severed at the appropriate lengths. This technique can be adapted to a wide variety of materials, and can be automated providing a vast number of color chips with unique color combinations, each color code bar corresponding to a number in the same manner as the values of resistors are provided. Dispensing of the microlabel can be accomplished via a vibrating bowl feeder if the individual microlabels are supplied in bulk, or from a preassembled carrier tape, from a wafer, strip or tape, with the microlabel broken off as needed.

Reading or scanning of the microlabel is performed automatically. Scanning can involve mechanical motion or preferentially lack such motion. Several scanner sensors include those available from Vidak, a division of Kodak Inc. of Rochester, N.Y. This sensor system consists of three parallel linear arrays having 1024 or 2048 light sensitive receptors per array. One array is for receiving a primary Red (R), a second for a primary such as Blue (B), the third for a primary such as Green (G). The combination of R, B, and G in varying relative intensities enables sensing all the colors of the visible spectrum.

Another sensing system consists of a single array, such that each receptor cell is set to sense a primary color or absence/presence (A/P) of signal, for instance in the sequence A/P-R-B-G-A/P-R-B-G-A/P-etc.

Another sensing system is based on the 'Selfoc' graded index optical fiber lens array, 'Selfoc' being the commercial name of a product made by the Nippon Sheet Glass Co. A functionally similar product is available from Corning Inc., of Corning New York, and is marketed under the name SMILE for Spherical Micro Integrated Lenses. Another scanner consists of a sequence reader scanning by electronically sequenced sensing. All of the above are viable for reading the subject microlabels for the automatic recognition and identification of the colored bar code.

BRIEF DESCRIPTION OF DRAWINGS

These and other features of the subject invention will be better understood taken in conjunction with the Detailed Description in conjunction with the Drawings of which.

DETAILED DESCRIPTION

Figure 1:
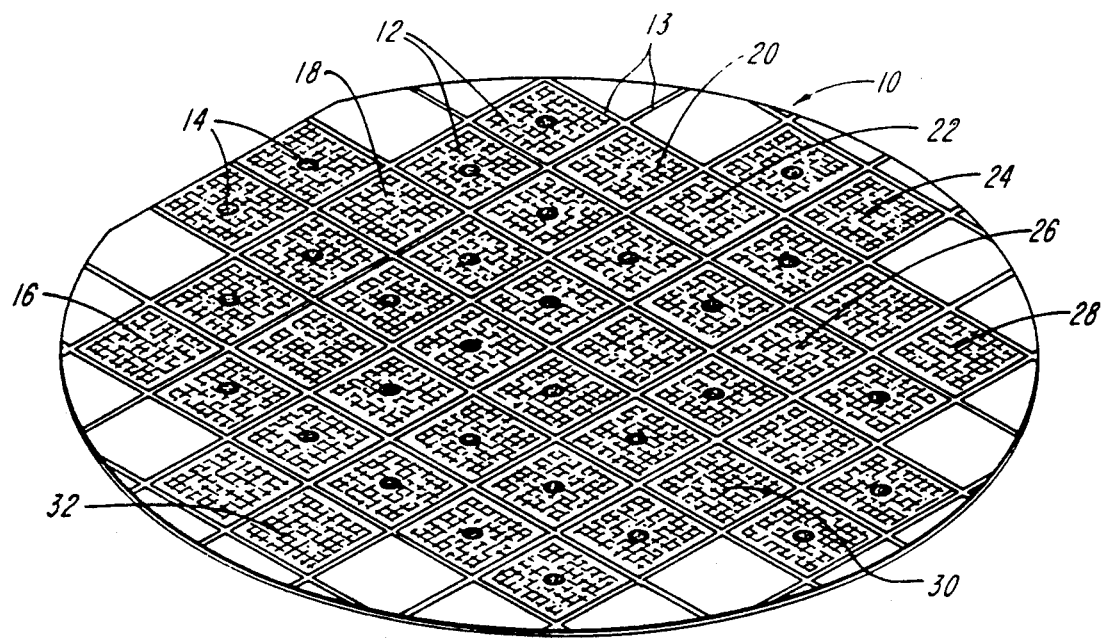
FIG. 1 is a diagrammatic representation of a prior art method for identifying a pass/fail characteristic of an individual die on a wafer.

Referring now to FIG. 1, a typical wafer 10 is illustrated as having a plurality of dies 12 located therein and separated one from the other via streets or score lines running in a rectilinear pattern in a grid across and through the wafer. Each of the individual dies is provided with an ink dot 14 if the particular die has passed a predetermined probe test. It will be noted that wafers 16, 18, 20, 22, 24, 26, 28, 30, and 32 are devoid of ink dots, thereby indicating that these wafers have failed a predetermined probe test. What will be appreciated from this diagram is that this simplistic method of marking dies is basically a binary system in which only one feature of the particular die can be denoted either by the presence or absence of an ink dot. The most common use of this type of system is for a pass/fail system, which, as mentioned before, fails to take into account that while the particular die may in some sense have failed a predetermined test, it in and of itself may be useful in another application. Thus, for instance, should a die fail a test such as a rather rigid Mil. Spec. test, it may still be a military or commercially viable device, suitable for use in some application. Moreover, the pass-/fail tests fail to recognize that currently dies have redundant circuitry or embedded programming, such that while a portion of the die may be defective, the remainder of the die may be functioning properly. Such a pass/fail test as illustrated in FIG. 1 fails to identify those dies which still have some useful topology. As a result, the yield typical on such wafers is on the order of 70%, which leaves 30% of the dies as being labelled as having failed.

Figure 2:
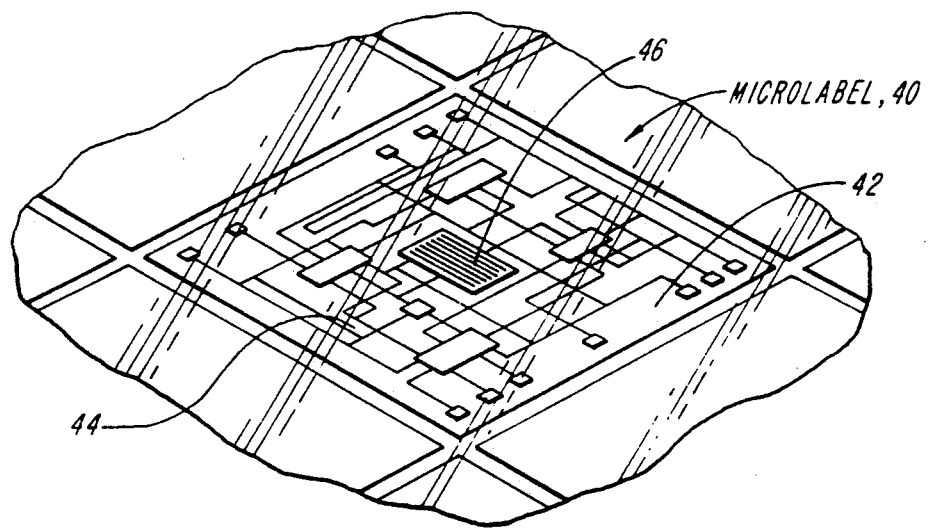
FIG. 2 is a diagrammatic illustration of the subject microlabel affixed to the top surface of an individual die on a wafer, with color bars or other indicia placed thereon indicating not only a pass/fail characteristic of the die but other types of information.

In an effort to increase the yield of a semiconductor processing technique such as described in FIG. 1, and referring now to FIG. 2, it is the purpose of the subject invention to provide a microlabel, here shown at 40, to be affixed to the top surface 42 of an individual die 44, with the microlabel carrying indicia 46, here shown in the form of a bar code, which enables the labelling of the die with a much greater amount of information.

It will be seen, that such a microlabel can be manufactured on-the-fly so as to correspond to the particular measured parameters of an individual die, with the microlabel being produced in real time and affixed to the top surface of the die during the probing and quality control process.

What will be appreciated is that by providing the microlabel with variable indicia, information about a large variety of conditions of the die can be permanently affixed to the dies such that by conventional bar code scanning techniques, the identification as well as the quality of the die or the circuits therein can be immediately ascertained through, for instance, flying spot scanners. These scanning techniques include the aforementioned Selfoc lens or the Smile lens which with suitable optics and computer processing provides the ability to read a small micro code in which the width of the bars can be as little as 20 microns or less.

Figure 3:
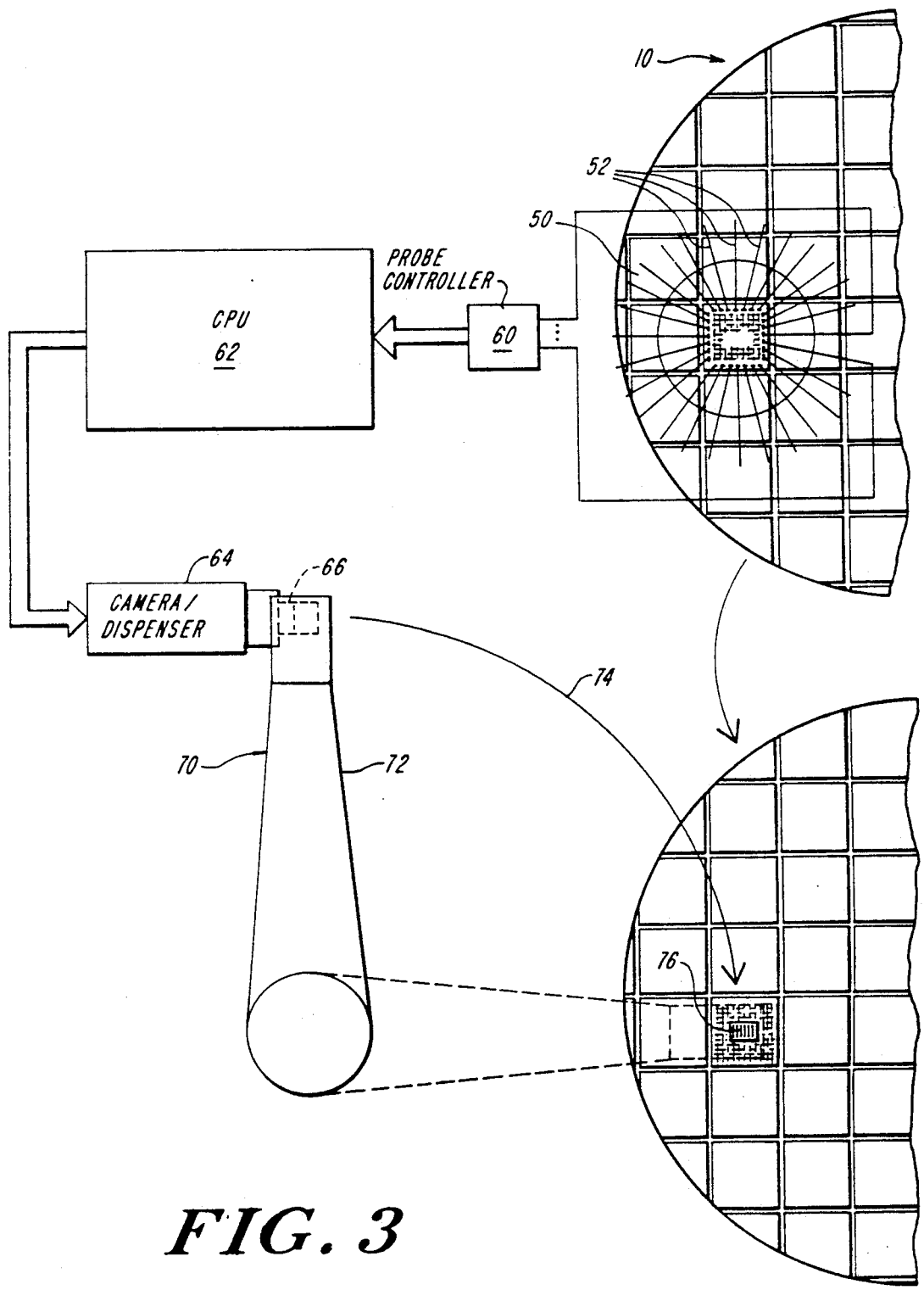
FIG. 3 is a schematic and diagrammatic representation of the probing of a die on a wafer to ascertain its quality or features to be recorded on a label, and the utilization of a camera/dispenser for producing a microlabel on-the-fly, also indicating a pick and place mechanism for placing a label on the corresponding die.

Referring now to FIG. 3, in a typical application wafer 10 is provided with probing apparatus 50 which includes a plurality of probe tips 52 that protrude through an aperture 54 in a circuit board to which the probe tips are anchored. In a typical application the probe tips are inwardly and radially directed with the ends of the tips being positioned or indexed to contact lands or pads 56 on the top surface of an individual die 58. The individual probe tips are connected to apparatus 60 which serves to detect and analyze the signals from various probes. The output of the unit 60 is provided to a CPU 62 which is utilized to control a camera/dispenser 64 that produces microlabels 66 on-the-fly. Each of the microlabels is unique in that it corresponds uniquely to a single die, with the coding on the microlabel being changed to reflect the characteristics, identity or quality of the particular die. In the pictured pick-and-place mechanism 70, an arm 72 is utilized to pick up the severed microlabel 66 and move it as indicated by arrow 74 to the appropriate position 76 on the die that has been tested. The microlabel can be affixed adhesively to the top surface of the individual die, with the adhesive being such that it is not destroyed in any further downstream processing.

Moreover, it is important that the adhesive utilized in affixing the microlabel to the top surface of the die not affect the underlying circuit or its topology. Nor can the adhesive affect any process, such as wire bonding which is subsequent to the probing and test procedure.

Figure 4:
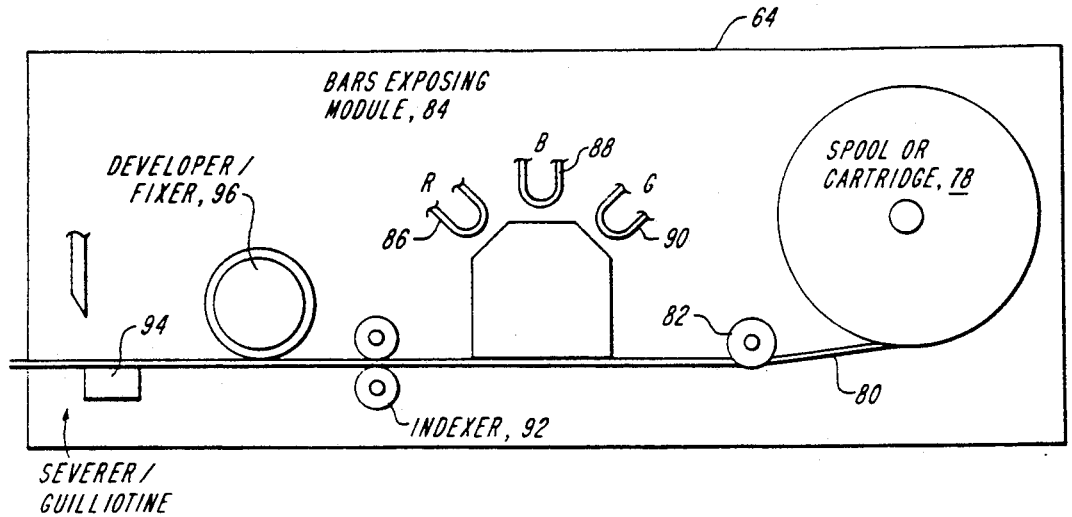
FIG. 4 is a schematic representation of the camera/dispenser of FIG. 3 illustrating the utilization of photographic film onto which is patterned or exposed a predetermined set of indicia which, when developed and the labels severed provides a label with unique indicia, with the indicia being varied at will in a real time label production process.
Figure 5:
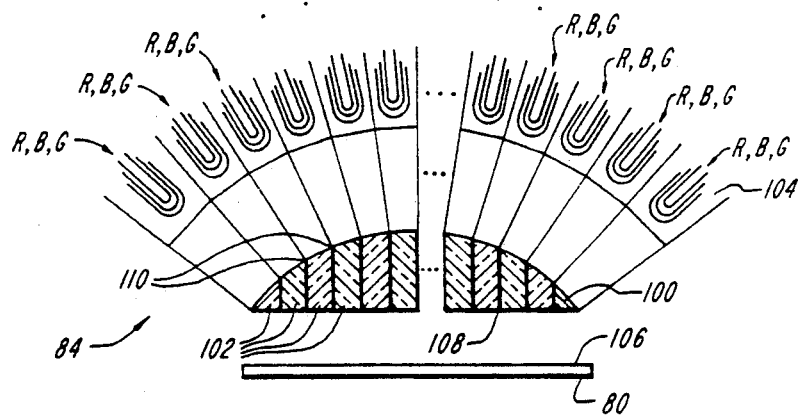
FIG. 5 is a cross sectional and diagrammatic illustration of the exposing module utilized in the exposing of the photographic film of FIG. 4, illustrating a composite lens which focuses different colored light to predetermined regions on the top surface of the underlying film.
Figure 6:
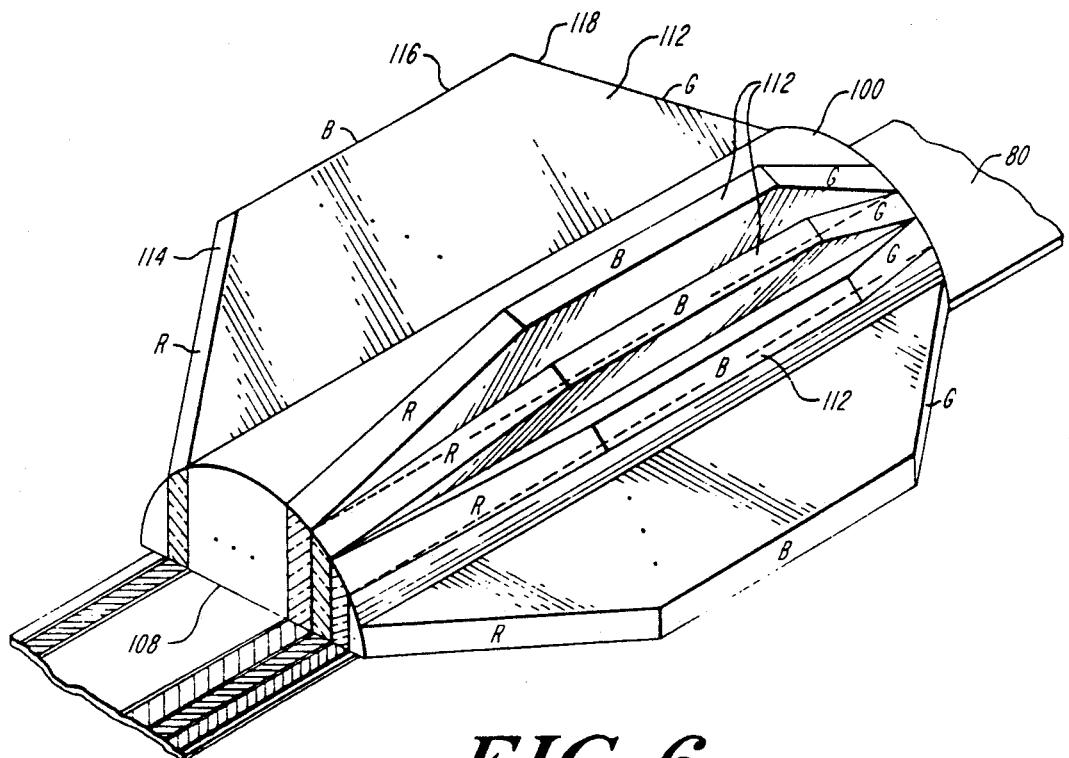
FIG. 6 is an isometric, cross sectional and diagrammatic illustration of the composite lens of FIG. 5, illustrating the half cylindrical nature of the lens and the imposition on the top thereof of a set of prisms for focusing respectively Red, Blue, and Green light in combination, along a stripe underlying the flat surface of the composite lens.

Referring now to FIG. 4, camera/dispenser 64 is shown having a spool or cartridge 78 of film 80, which in a preferred embodiment is an instant developing film such as manufactured by Polaroid Corporation of Cambridge, Mass. This film is led via rollers 82 past an exposing module 84, the purpose of which is to provide stripes of different color on the film as the film is transported past the exposing module. In one embodiment, the stripes are provided through the utilization of a combination of Red, Green, and Blue light from sources 86, 88, and 90 respectively which can be in the form of light emitting diodes or other colored light sources. The mixing of the intensity of these in a prismatic device which will be described in connection with FIGS. 5 and 6 provides the ability to produce exposure on the emulsion of the film in accordance with a particular hue or color desired. Additionally, the exposing module may simply provide alpha numeric labelling on the surface of the film through the utilization of focused masks or other photographic techniques, with the alphanumeric indicia being capable of being produced in the sub millimeter sizes associated with microlabelling. Alternatively, one can have an exceedingly small bar code and a relatively over-sized alphanumeric indication adjacent thereto with the alphanumeric indications being produced, for instance, via dot matrix techniques. However, what is important is that the area circumscribed by the indicia be no larger than that capable of being placed effectively on an individual die which, as described hereinbefore is labelled with a microlabel potentially no bigger than 2 millimeter by 2 millimeter. The reason for the small size of the label on the die is so that the affixing of the label to the die does not occlude any of the lands nor contact pads to which wires must be bonded in a subsequent process.

After exposure, film 80 is passed through an indexing module 92 which precisely locates the microlabel such that its correspondence to a particular die may be established due to its position relative to the severing unit 94 which in a preferred embodiment is a guillotine-type severing apparatus. Prior to the severing of the individual microlabels, should a developer/fixer stage be required for the particular film, this is accomplished, in one embodiment, between indexing unit 92 and severing unit 94 as illustrated diagrammatically at 96.

The result is the ability to instantaneously pattern or produce a microlabel in accordance with any predetermined information derived from the die or other article such that the label, rather than having to be produced in a batch process and then picked over to provide the appropriate code, is now provided instantaneously with the code which corresponds to the condition of the die which has been probed.

Referring now to FIG. 5 in one embodiment, the exposing module 84 includes a composite lens 100 which is in the form of a half cylinder, shown in FIG. 5 to be located immediately above film 80. It is the purpose of the segments 102 of this lens to effectively provide a light pipe or conduit from a source 104 to a location 106 immediately beneath the flat face 108 of lens 100. Composite segments of the lens are pieced together with separating material 110 therebetween, the purpose of which is to prevent light leakage from one segment to the other. This provides a longitudinally running strip of light which is uniquely associated with the corresponding combination light sources.

Referring now to FIG. 6, lens 100 is provided with a plurality of trapezoidally-shaped prisms 112 which are utilized to combine Red, Blue, and Green light entering flat surfaces 114, 116, and 118 respectively so as to provide light of the desired hue or color to expose film 80 as it passes beneath flat surface 108 of lens 100. It will be appreciated that the utilization of this optical device to combine various colors can include other types of light mixing devices. However, for the purposes of providing a longitudinal stripe of a predetermined color at a predetermined position on film 80, the trapezoidally shaped prism provides a unique compact method of altering the hue of the light utilized for any particular microlabel.

It will also be appreciated that lens 100 and prisms 112 can be made integrally, thereby eliminating any interface problems which might occur at the prism/lens interface.

Additionally, as the film passes underneath the lens, it may be provided with either an acrylic-based or silicone-based, or other appropriate adhesive which does not affect the operation of the underlying die nor its circuits. Moreover, as is known, acrylic based and silicone based adhesives are relatively easy to apply to an underneath surface of a moving web, since they are contact adhesives. Alternatively, the film may be provided with a contact adhesive backed with a protective sheet or layer which can be peeled off or skived off at the appropriate moment.

Figure 7:
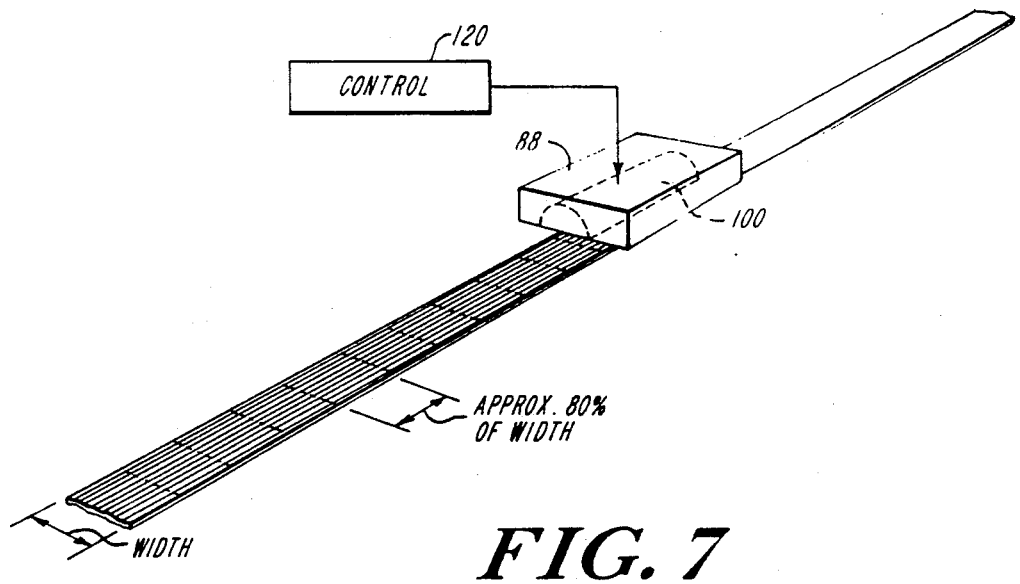
FIG. 7 is a diagrammatic illustration of the exposing module of FIG. 5, illustrating the production of microlabels having different color coded patterns thereon responsive to control of the exposing module in accordance with sensed information.

Referring now to FIG. 7, exposing module 88 with lens 100 is shown providing a number of differently patterned, consecutively produced microlabels through the utilization of a computer control 120 such that each individual microlabel may be given a unique and different code.

Figure 8:
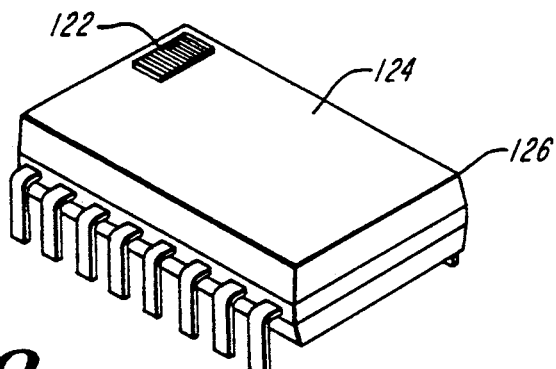
FIG. 8 is an isometric and diagrammatic illustration of an encapsulated die or chip in which the top surface of the encapsulation is provided with a microlabel indicating, inter alia, the type, status, and information relative to the encapsulated die.

As illustrated in FIG. 8, the same label-producing system may be utilized to provide a microlabel 122 on the top surface 124 of encapsulation 126 thereby to provide on the top surface of an encapsulated die the information contained on the top surface of the internally-carried die should such be desired.

Figure 9A:
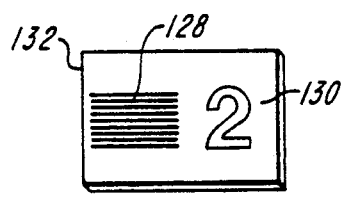
FIGS. 9A, 9B, and 9C are diagrammatic illustrations of the indicia to be placed on a microlabel, indicating that bar codes as well as alpha numeric indicia may be utilized, also showing the ability to change the indicia on-the-fly such that each microlabel can be specifically tailored to the object it is labelling, without manufacturing the microlabel in a batch process.
Figure 9B:
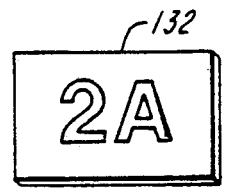

Referring now to FIG. 9A, it will be appreciated that a bar code indicia 128 may be co-located with alphanumeric indicia 130 on an individual microlabel 132. This provides for the ability to provide rough encoding through the utilization of the alphanumeric indicia, followed by detailed information provided by bar coding. As illustrated in FIG. 9B, the labelling of the microlabel 132 is not restricted to bar coding. Rather alphanumerics may be utilized, assuming the size of the alphanumeric indicia is within the microlabel's extent.

Figure 9C:
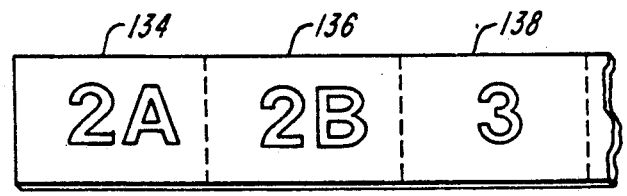

Referring to FIG. 9C, it will be seen that microlabel 134 bears different indicia than microlabel 136 which is further differentiated from microlabel 138 as can be seen. By utilization of the aforementioned photographic technique, it is possible to vary the indicia on-the-fly, with the FIG. 9C illustration showing this consecutive variation, it being understood that the bar codes can be similarly varied.

Figure 10A:
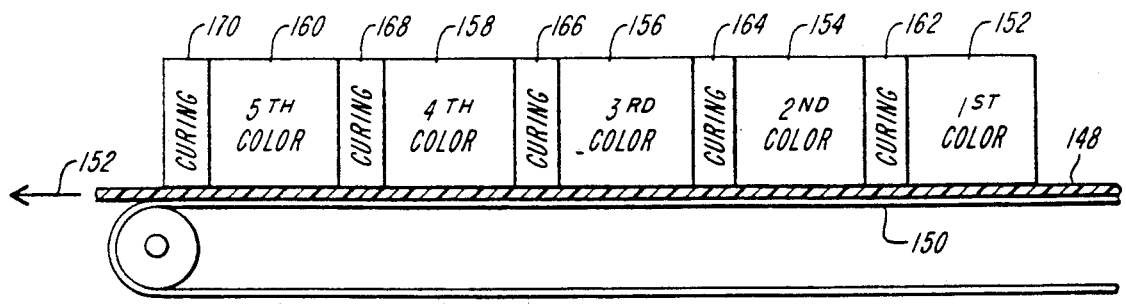
FIGS. 10A, 10B, 10C, 10D, and 10E are diagrammatic illustrations of a process for making microlabels involving vapor or droplet deposition on a moving substrate in a sequence designed to build up multiple layers of differing color such that, when the composite is shaved and scored, multiple similar microlabels are produced.
Figure 10B:
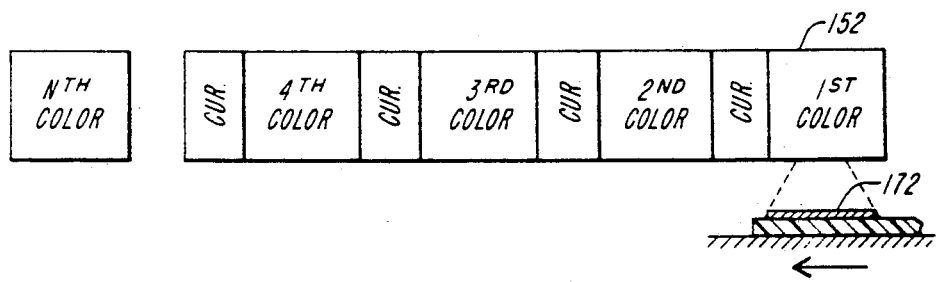
Figure 10C:
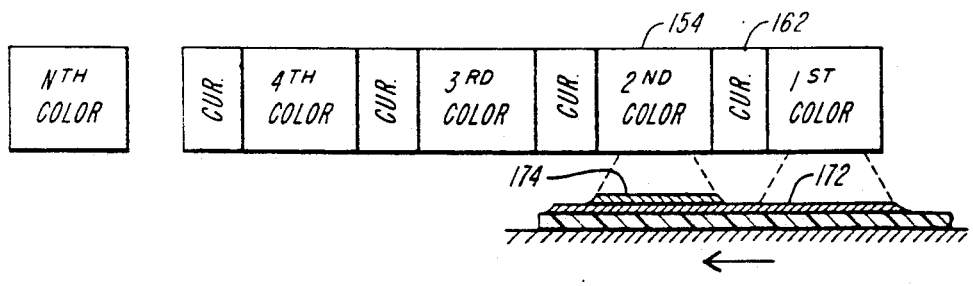
Figure 10D:
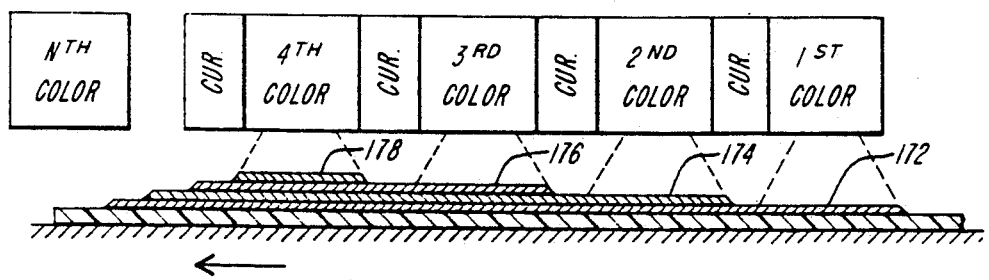
Figure 10E:
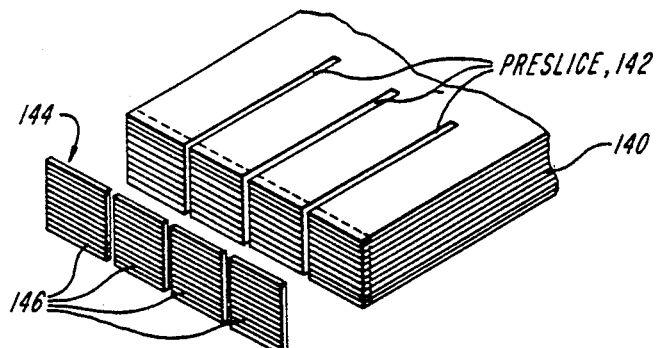

Referring now to FIG. 10, a batch process for forming of microlabels is illustrated in FIG. 10E. Here multiple layers 140 are illustrated as being pre-sliced at 142 and shaved as illustrated at 144 to produce individual microlabels 146. It will be appreciated that in this batch process the coding carried by each of the individual microlabels 146 is identical.

In order to provide such a layered structure and referring now to FIG. 9A, in one embodiment, a moving substrate 148 is provided over a moving belt 150 which drives the substrate in the direction illustrated by arrow 152. On top of the substrate is located a number of color droplets or vapor-containing chambers 152-160 separated by curing chambers 162-170 as illustrated.

Referring now to FIG. 10B, the first color is deposited from chamber 152 as illustrated by layer 172; whereas, as illustrated in FIG. 10C, a second differently colored layer 174 is produced on top of layer 172 from chamber 154 after the first layer has been cured by passing under chamber 162. As illustrated in FIG. 10D, multiple further layers of different color layers 176 and 178 are deposited over layer 174 with the deposition of the layers being cured prior to the deposition of a further layer.

The result, as mentioned before is illustrated in FIG. 10E in which large numbers of similarly-encoded microlabels can be produced in rapid order.

With respect to curing, curing can be accomplished through the utilization of heat, ultraviolet light, microwave, or other radiation as appropriate to the particular chemistry.

Figure 11:
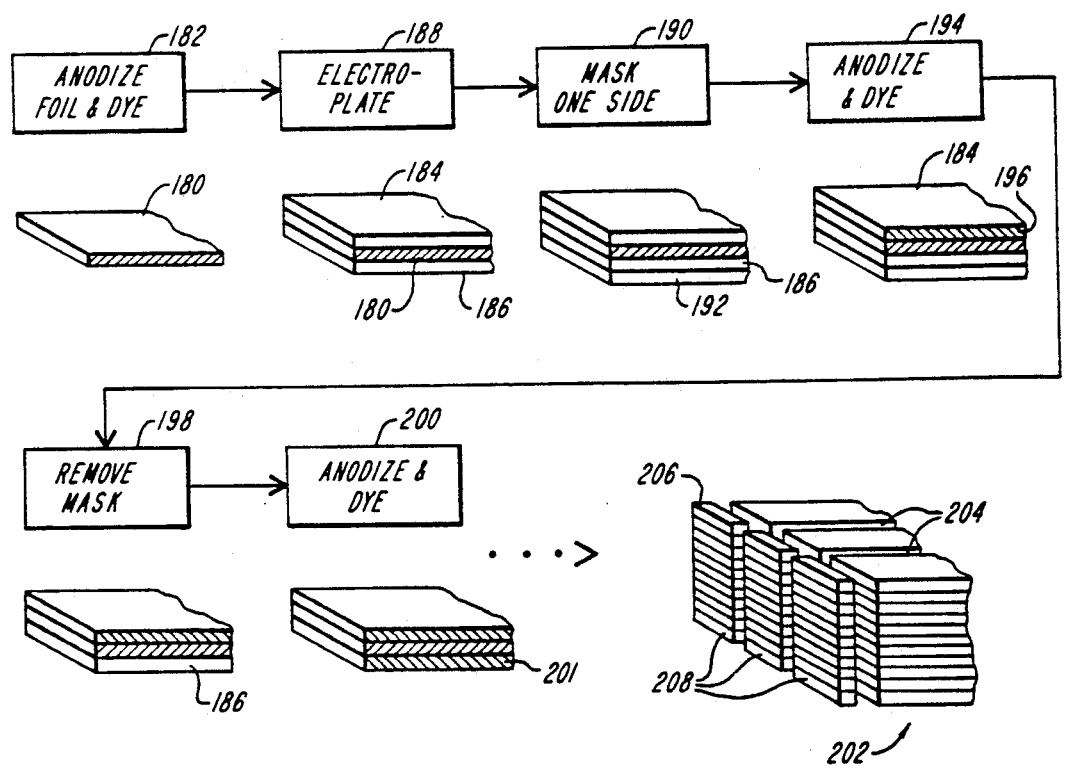
FIG. 11 is a schematic and diagrammatic representation of a method of manufacturing microlabels utilizing anodized and dyed foil followed by an electroplating and masking process such that each of the metallic layers is anodized and dyed to provide for its distinctive color, with the final product being shaved and scored to provide the subject microlabels.

Referring now to FIG. 11, a further process for the manufacture of microlabels includes the utilization of an anodizing and dying process for aluminum foils or leaves. As can be seen from FIG. 11, an initial aluminum foil layer 180 is irridited and dyed as illustrated in 182 so as to provide the layer with a predetermined color. Thereafter layers 184 and 186 are electroplated to either side of layer 180 as illustrated at 188. This step is followed by a masking step illustrated at 190 in which a masking layer 192 is applied to the exposed surface of layer 186 as illustrated. Thereafter, as illustrated by the irridite and dying step 194, the exposed aluminum layer 184 is provided with a distinctive color as illustrated at 196. Thereafter, mask 192 is removed at step 198 so as to provide an exposed face for layer 186. Thereafter the exposed layer is irridited and dyed as illustrated at 200 to provide a differently colored layer 201. The process can be repeated with a build up of differently colored layers as illustrated at 202, with the layered device being presliced as illustrated at 204 and shaved so as to provide a slice 206 as illustrated. The scoring of the layered device provides individual microlabels 208. It will be appreciated that the limiting factor on the irriditing process is the ability of penetration of the irriditing process, which is dependent on the thickness of the aluminum foil and process parameters. It will be appreciated, however, that it is important that the dye penetrate throughout the layer so that the entire layer is colored in accordance with the desired hue.

Figure 12:
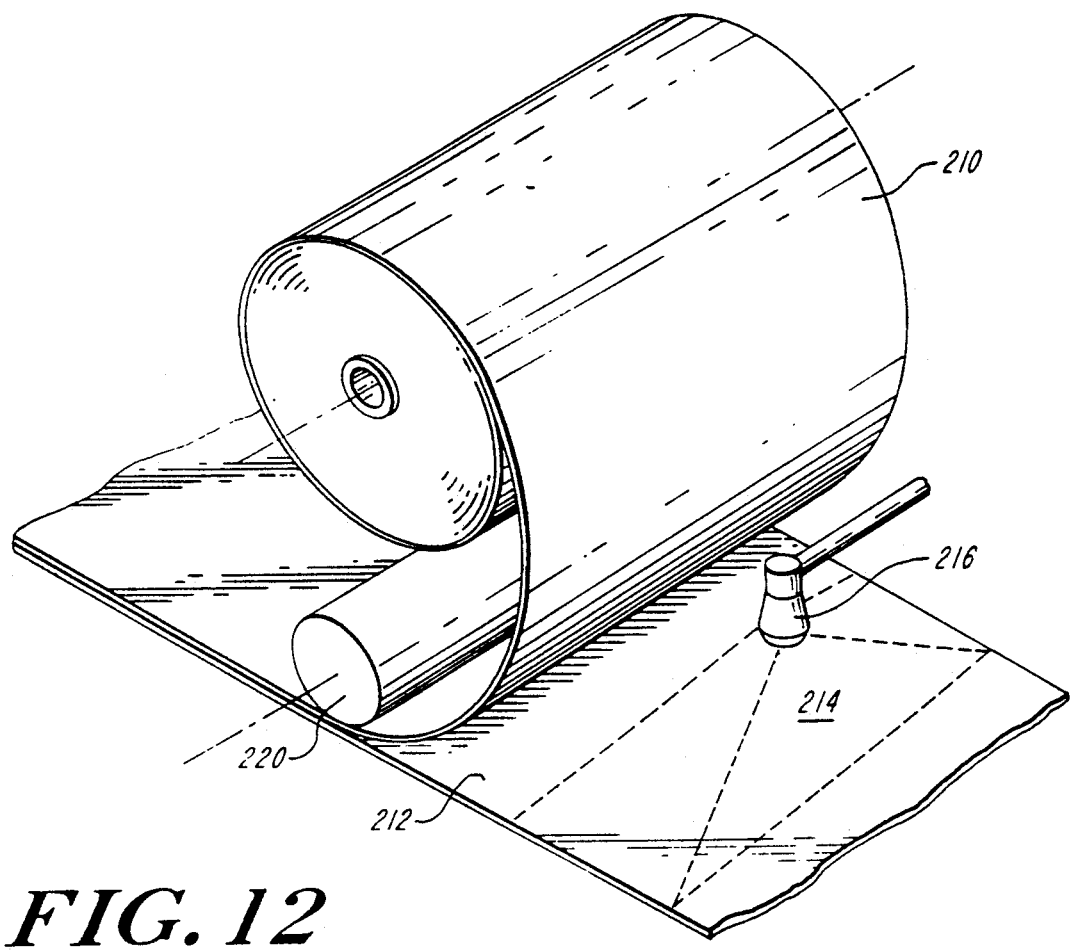
FIG. 12 is a diagrammatic representation of the layering of differently colored metallic layers, one on the other, through a process of adhesive binding of a metallic later to a substrate and the building up of multi-colored layers thereby, with the microlabel being produced via shaving and scoring.

Referring to FIG. 12, a further process utilizing colored metallic foils is illustrated in which a first metallic foil 210 is applied adhesively to a second metallic foil 212 through the use of a sprayed adhesive 214 from a nozzle 216 upon after which, the layers are calendared together via calendar 220 to provide composite layers. This process can be repeated a number of times with differently colored foils or metallic layers to provide the device which is to be sliced, severed, or shaved for producing the above-mentioned microlabels. It will be appreciated that the adhesive itself can be utilized as a color separator so as to provide separation between the various color bar codes. As such the foil may be of 20 thousandths of an inch thickness, whereas the adhesive therebetween can also be of a 20 thousandths thickness to provide for optical separation.

Figure 13:
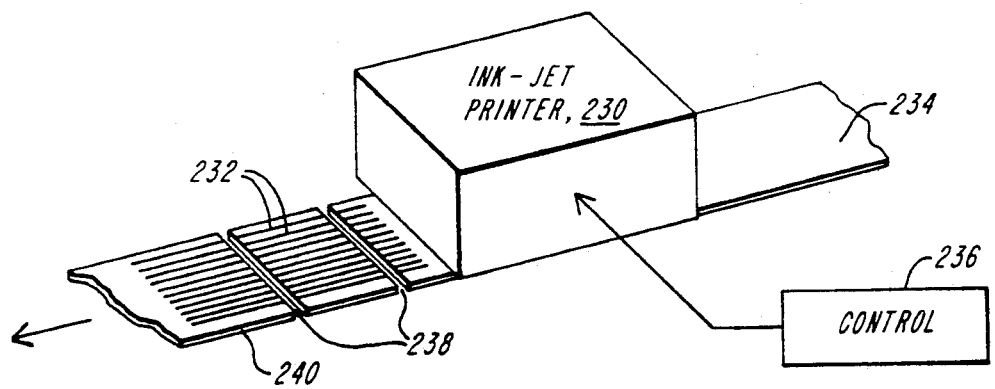
FIG. 13 is a diagrammatic representation of the manufacture of microlabels utilizing an ink jet printer which is controlled to provide parallel lines of differing colors along a moving substrate, with the substrate being severed to provide the microlabels.

Referring now to FIG. 13, the microlabels can also be provided by a conventional ink jet printer 230 which is utilized to produce encoding stripes 232 on a moving substrate 234 under the control of the control unit 236 which provides for on-the-fly manufacture of the microlabels. Upon being scored at lines 238, the result is a uniquely encoded microlabel 240.

Figure 14A:
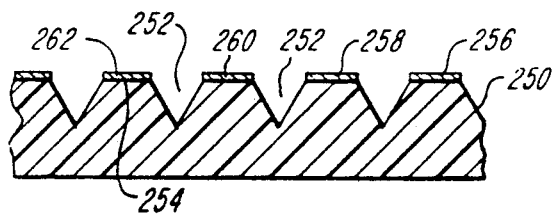
FIGS. 14A and 14B are cross sectional diagrams of a portion of a scored or grooved substrate indicating the preparation of differently colored longitudinally running lines in or on the surface of the substrate, with the substrate being severed to provide the microlabels.
Figure 14B:
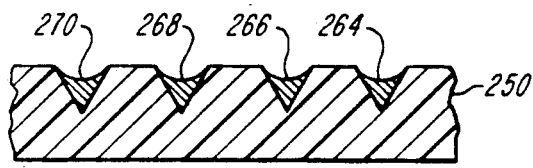

Referring now to FIGS. 14A and 14B, a substrate 250 may be provided with furrows or rows 252 in a regular pattern across one surface 254 thereof. The scoring, etching, or forming of these furrows or rows can be done conventionally so as to provide a number of parallel rows across the top surface. These rows can be provided with colored material 256-262 which is uniform and which provides, in one embodiment, a color separator for the optical sensing of the colors carried within the furrows or rows. As illustrated in FIG. 250 whether or not such color separators are utilized, ink or other colored materials of differing hue may be deposited in the furrows as illustrated at 264-270 so as to provide the substrate with the required colored bar code. Thereafter the substrate can be severed into microlabels.

Figure 16:
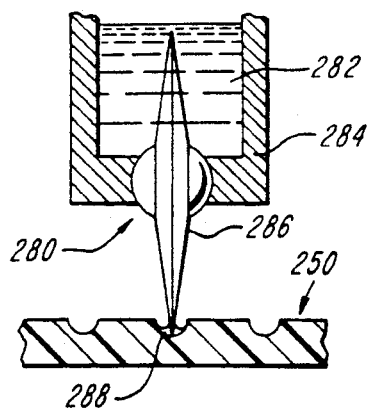
FIG. 16 is a cross sectional and diagrammatic illustration of one method of providing ink of a predetermined hue or color in a predetermined furrow or row for the substrate of FIGS. 14A or 14B through the utilization of an ink transfer wheel.
Figure 15:
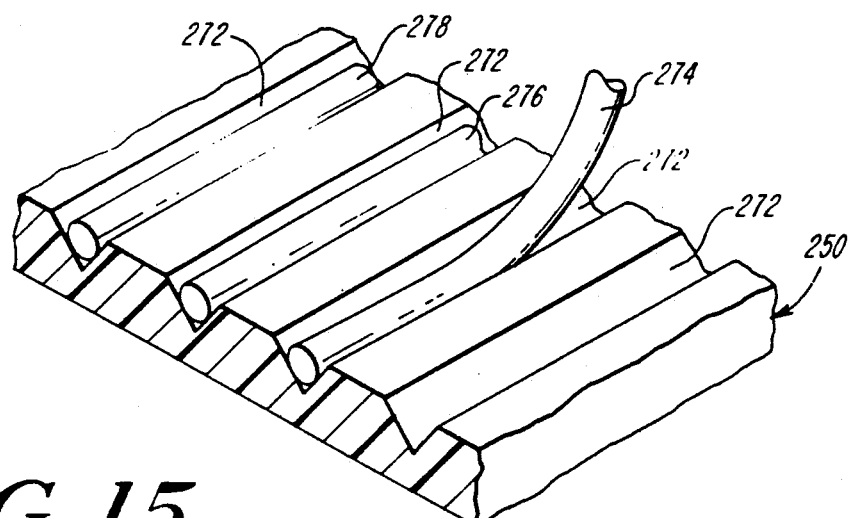
FIG. 15 is an isometric and diagrammatic illustration of one method of providing colored grooves or furrows for the labels of FIGS. 14A and 14B through the provision of a deposited microwire of a predetermined color or hue, or the provision of a stream of ink in the corresponding furrow.
Figure 16:
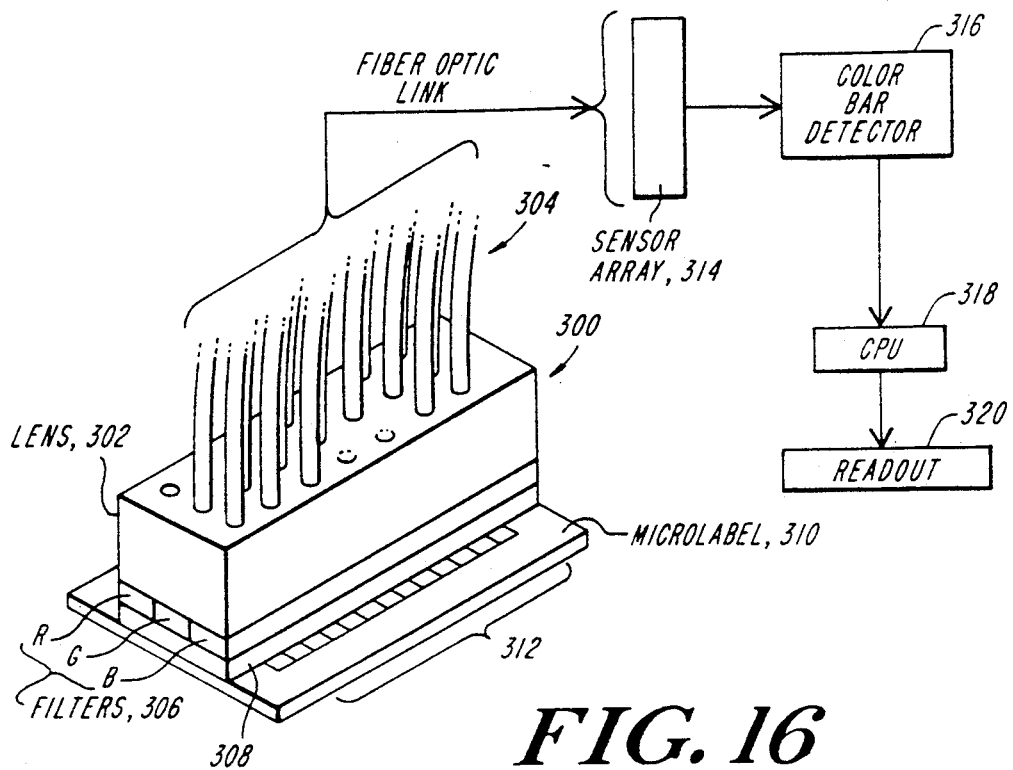

As illustrated in FIG. 15, one method of providing substrate 250 with different colored material for the furrows, here shown as V-shaped channels or slots 272 involves the utilization of depositing differently colored wires 274, 276, and 278 in respective slots or furrows. These wires alternatively can be utilized as a wicking device for wicking the various inks or dies into the respective channels such that the ink or die is made to run down or through the wire or other wicking device. Referring now to FIG. 16, colored inks or dies may also be deposited in a given furrow or channel through the utilization of an ink transfer wheel 280 which transfers ink from a bath 282 in a container or vessel 284 along the edge 286 of the wheel into the particular furrow or slot 288. Here the ink is transferred by the edge of this wheel which may be made suitably sharp so as to permit the depositing of the ink in an exceedingly narrow line.

What is described now are methods and apparatus for scanning and reading out the bar codes.

Figure 17:
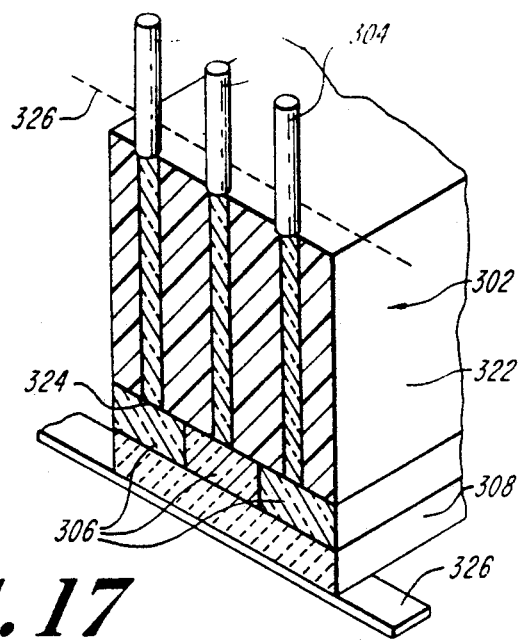
FIG. 17 is a diagrammatic illustration of a bar code reading system for the subject microlabels.

Referring now to FIG. 17, a read head 300 includes a lens 302 in which optical fibers 304 are embedded. Beneath lens 302 are optical filters 306 which include Red, Green, and Blue filters as illustrated. At the bottom of the head is a transparent window 308 beneath which is located a microlabel 310 having color bars 312 which form the aforementioned bar code. The optic fibers are coupled to a sensor array 314 which is in turn coupled to detector electronics 316, the output of which is coupled to a CPU 318 which is thence coupled to a readout unit 320 to provide a functional or an alphanumeric readout of the bar code.

Figure 18:
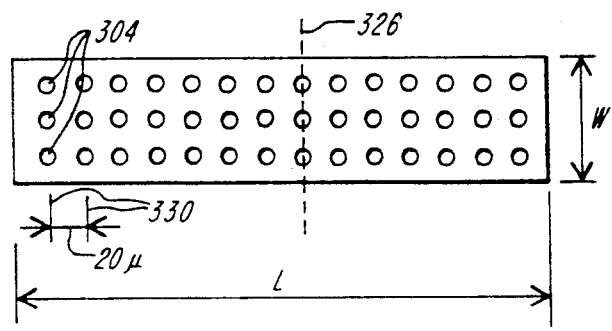
FIG. 18 is a cross sectional and diagrammatic view of a portion of the read head of FIG. 17 illustrating the embedded optical fiber trio arrangement; and, FIG. 19 is a bottom view of the read head of FIG. 17 illustrating the ends of the optical fibers and their arrangement vis a vis Red, Green, and Blue filters.

Referring to FIG. 18, a cross sectional view of head 300 is shown in which individual optical fibers 304 are illustrated as passing through the body 322 of lens 302 at which point the faces of the fibers are terminated at a lower face 324 of lens 302. It will be appreciated that along a reading direction shown by dotted line 326 in a preferred embodiment, there are a trio of individual optical fibers, the combination of the outputs of which are utilized to provide the color or hue of the particular color encoded stripe 326 which is passing therebeneath and under window 308.

Each of the individual optical fibers which are aligned with this stripe receive light through the Red, Green, and Blue filters 306 placed at the entrance port to each trio of fibers. By so doing, the hue or color of the particular color bar is read out in terms of its Red, Green, and Blue content which, as can been seen from FIG. 17 is detected by color bar detector 316, the output of which is coupled to CPU 318 which, in accordance with an internal program determines the color or hue of the particular stripe. Alternatively, the appropriate filters 306 may be located at the output side of the optical fibers 304 but before the color bar sensor array 314. The color hue of the series of stripes constitutes a bar code which is read out at unit 320 to provide a digital read out of the number corresponding to the code represented by the colored bars or stripes.

It will be appreciated that, as seen in FIG. 19, the numbers of trios of optical fibers 304 determines the maximum number of bar codes that can be read by the particular head. Fourteen such rows are illustrated which can accommodate a 14 stripe bar code. Assuming the bar codes are 20 microns in width the inter fiber spacing as illustrated by arrows 330 are on the order of the width of the bar coding stripes for reading the maximum number of code bars. It will be noted that the light filters' diameter or width must match the width of the narrowest color bar or separator, whereas the length of the lens is greater than the width of the microlabel and whereas the width of the lens is shorter than the length of the color bars on the microlabel. Note here that filters 306 run side by side longitudinally down the face of the head. Alternatively, the filters can be positioned at the sensor array. Moreover, the filters may be made to transmit light of other than the Red, Blue, Green trio described above, as long as the result is appropriate determination of color of the underlying stripe.

Having above indicated a preferred embodiment of the present invention, it will occur to those skilled in the art that modifications and alternatives can be practiced within the spirit of the invention. It is accordingly intended to define the scope of the invention only as indicated in the following claims:

What is claimed is:

1. A method for identifying and encoding integrated circuit components comprising:

adhering a microlabel having a side-by-side colored bar code onto a surface of a finished integrated circuit component with the microlabel having unique indicia thereon corresponding to the identity and quality of the finished integrated circuit component to provide an overtly readable label, the microlabel being readable from a given direction due to the fixed orientation of the microlabel which conforms to the surface configuration of the component on which the microlabel is adhered; and, machine reading said code and generating a digital representation thereof.

2. The method of claim 1 wherein said microlabel includes a bar code having stripes of a 5-120 micron width.

3. The method of claim 1 wherein the integrated circuit component is an integrated circuit die.

4. A method for identifying and encoding an already formed finished and completed component comprising:
adhering a microlabel having a side-by-side bar code onto a surface of said already formed, completed, and finished component with the microlabel having unique indicia thereon corresponding to the identity and quality of said component, said microlabel having a different code for a different identity and quality of a component, said microlabel being readable from a given direction due to the fixed orientation of the microlabel which conforms to the surface configuration of the component on which the microlabel is adhered; and,
machine reading said code and generating a digital representation thereof.

5. The method of claim 4 wherein the integrated circuit die is in a wafer.

6. A method for identifying and encoding a small electronic component comprising:
adhering a microlabel having a side-by-side colored bar code and an extent less than 2 millimeter×2 millimeter onto the surface of a finished electronic component, with the microlabel having a bar code with stripes of a width less than 120 microns to provide an overtly readable label, the microlabel being readable from a given direction due to the fixed orientation of the microlabel which conforms to the surface configuration of the component on which the microlabel is adhered; and,
machine reading said code and generating a digital representation thereof.

7. The method of claim 6 wherein the microlabel includes non-bar code indicia.

8. The method of claim 6 wherein the bar code includes multi-colored stripes.

9. A method for identifying and encoding a small electronic component comprising:
adhering a microlabel having a side-by-side colored bar code and an extent less than 2 millimeter×2 millimeter onto the surface of a finished electronic component to provide an overtly readable label, the microlabel being readable from a given direction due to the fixed orientation of the microlabel which conforms to the surface configuration of the component on which the microlabel is adhered; and,
machine reading said code and generating a digital representation thereof.

* * * * *